United States Patent
Li et al.

(10) Patent No.: US 10,665,310 B2
(45) Date of Patent: May 26, 2020

(54) ERROR CHARACTERIZATION AND MITIGATION FOR 16NM MLC NAND FLASH MEMORY UNDER TOTAL IONIZING DOSE EFFECT

(71) Applicant: California Institute of Technology, Pasadena, CA (US)

(72) Inventors: Yue Li, Pasadena, CA (US); Jehoshua Bruck, La Cañada Flintridge, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 16/259,143

(22) Filed: Jan. 28, 2019

(65) Prior Publication Data

US 2019/0172545 A1 Jun. 6, 2019

Related U.S. Application Data

(63) Continuation of application No. 15/849,423, filed on Dec. 20, 2017, now Pat. No. 10,224,111, which is a continuation of application No. 15/298,171, filed on Oct. 19, 2016, now Pat. No. 9,870,834.

(60) Provisional application No. 62/243,402, filed on Oct. 19, 2015.

(51) Int. Cl.
*G11C 16/34* (2006.01)
*G11C 16/16* (2006.01)
*G11C 16/10* (2006.01)
*G11C 16/04* (2006.01)

(Continued)

(52) U.S. Cl.
CPC ...... *G11C 16/3495* (2013.01); *G11C 16/0466* (2013.01); *G11C 16/10* (2013.01); *G11C 16/16* (2013.01); *G11C 29/44* (2013.01); *G11C 2029/0409* (2013.01); *G11C 2211/5641* (2013.01)

(58) Field of Classification Search
CPC . G11C 16/3495; G11C 16/0466; G11C 16/10; G11C 16/16
USPC ........................................ 365/185.03, 185.09
See application file for complete search history.

(56) References Cited

U.S. PATENT DOCUMENTS 9,870,834 B2 * 1/2018 Li ........................... G11C 29/44
2012/0268994 A1 * 10/2012 Nagashima ........ G11C 16/3418
365/185.11

(Continued)

OTHER PUBLICATIONS

"NAND Flash Memory Tester (SigNASII)", Available online at http://www.siglead.com/eng/innovation_signas2.html, 2010, 3 pages.

(Continued)

*Primary Examiner* — Anthan Tran
(74) *Attorney, Agent, or Firm* — Kilpatrick Townsend & Stockton LLP

(57) ABSTRACT

A radiation hardened NAND flash memory data storage device suitable for space flight having a plurality of memory cells configured to store data values in accordance with a predetermined rank modulation scheme and a memory controller that receives a current error count from an error decoder of the data device for one or more data operations of the flash memory device and selects an operating mode for data scrubbing in accordance with the received error count and a program cycles count. Methods of operating the data storage device are also described.

20 Claims, 13 Drawing Sheets

(51) Int. Cl.
    *G11C 29/44*    (2006.01)
    *G11C 29/04*    (2006.01)

(56) References Cited

U.S. PATENT DOCUMENTS

2015/0169468 A1* 6/2015 Camp ................. G06F 12/0246
                                                      711/207
2016/0086668 A1* 3/2016 Tam ................... G11C 16/3495
                                                     365/185.22

OTHER PUBLICATIONS

"Open NAND Flash Interface Specification", ONFI Revision 4.0, Available online at http://www.onfi.org/~/media/onfi/specs/onfi_4_0-gold.pdfla=en, Apr. 2, 2014, 315 pages.

Bagatin et al., "Sample-to-Sample Variability and Bit Errors Induced by Total Dose in Advanced NAND Flash Memories", IEEE Transactions on Nuclear Science, vol. 61, No. 6, Dec. 2014, pp. 2889-2895.

Bagatin et al., "TID Sensitivity of NAND Flash Memory Building Blocks", IEEE Transactions on Nuclear Science, vol. 56, No. 4, Aug. 2009, pp. 1909-1913.

Bagatin et al., "TID Sensitivity of NAND Flash Memory Building Blocks", European Conference on Radiation and Its Effects on Components and Systems, 2008, pp. 34-39.

Cai et al., "Flash Correct-and-Refresh: Retention-Aware Error Management for Increased Flash Memory Lifetime", IEEE International Conference on Computer Design (ICCD), Oct. 2012, 10 pages.

Gerardin et al., "Radiation Effects in Flash Memories", IEEE Transactions on Nuclear Science, vol. 60, No. 3, Jun. 2013, pp. 1953-1969.

Irom et al., "Scaling Effects in Highly Scaled Commercial Nonvolatile Flash Memories", IEEE Radiation Effects Data Workshop, 2012, 6 pages.

Jiang et al., "Rank Modulation for Flash Memories", IEEE Transactions on Information Theory, vol. 55, No. 6, Jun. 2009, pp. 2659-2673.

Kay et al., "Using Charge Accumulation to Improve the Radiation Tolerance of Multi-Gb NAND Flash Memories", IEEE Transactions on Nuclear Science, vol. 60, No. 6, Dec. 2013, pp. 4214-4219.

Li et al., "Data Archiving in 1x-nm NAND Flash Memories: Enabling Long-Term Storage Using Rank Modulation and Scrubbing", IEEE IRPS, 2016, 10 pages.

Mielke et al., "Bit Error Rate in NAND Flash Memories", IEEE IRPS, 2008, 10 pages.

Schmidt et al., "TID Test of an 8-Gbit NAND Flash Memory", IEEE Transactions on Nuclear Science, vol. 56, No. 4, Aug. 2009, pp. 1937-1940.

* cited by examiner

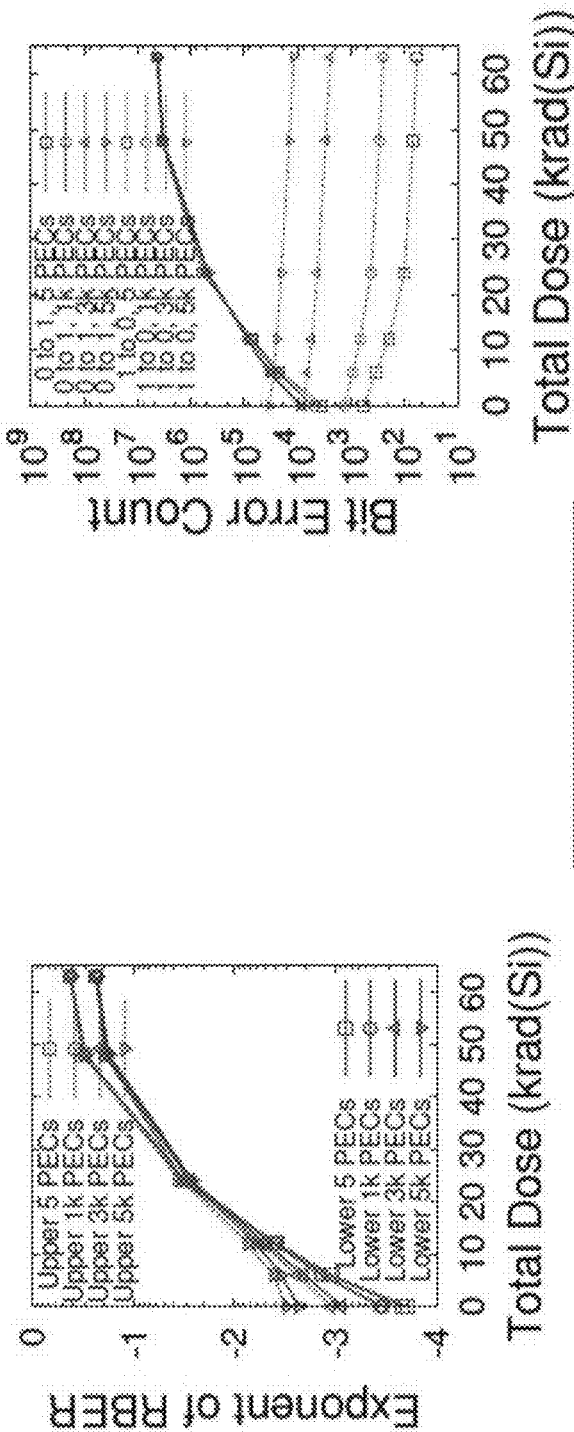
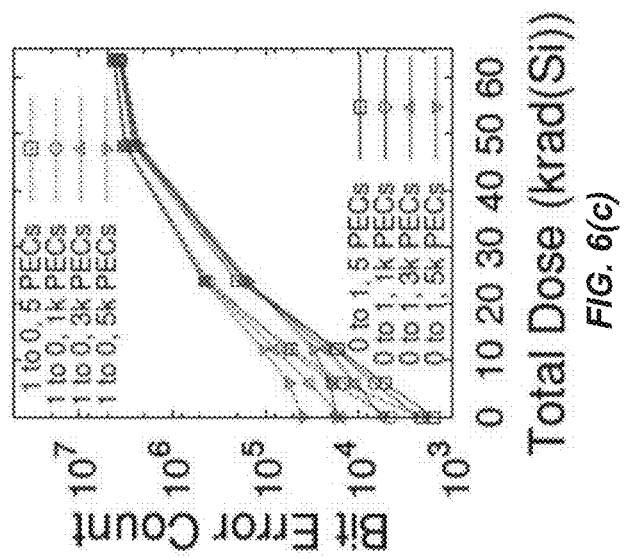
FIG. 6(a)
FIG. 6(b)
FIG. 6(c)

ERROR CHARACTERIZATION AND MITIGATION FOR 16NM MLC NAND FLASH MEMORY UNDER TOTAL IONIZING DOSE EFFECT

CROSS-REFERENCES TO RELATED APPLICATIONS

This application is a continuation of U.S. application Ser. No. 15/849,423, filed Dec. 20, 2017, which is a continuation of U.S. application Ser. No. 15/298,171, filed Oct. 19, 2016 (issued as U.S. Pat. No. 9,870,834), which claims the benefit of U.S. Provisional Application No. 62/243,402 filed Oct. 19, 2015 entitled, "ERROR CHARACTERIZATION AND MITIGATION FOR 16NM MLC NAND FLASH MEMORY UNDER TOTAL IONIZING DOSE EFFECT". The contents of the above-referenced applications are hereby incorporated by reference in their entireties for all purposes.

STATEMENT AS TO RIGHTS TO INVENTIONS MADE UNDER FEDERALLY SPONSORED RESEARCH AND DEVELOPMENT

The invention described herein was made in the performance of work under NASA contract NNN12AA01C, and is subject to the provisions of Public Law 96-517 (35 USC 202) in which the Contractor has elected to retain title.

BACKGROUND

NAND flash memory is an attractive media for primary storage in various space applications thanks to its excellent properties such as high density, low power consumption and random access. A necessary step to determine if a NAND flash memory is suitable for a specific space application is to test its reliability against radiation. In the scenarios where flash components must survive high radiation levels such as GEO orbits and other deep space trajectories, radiation hardened NAND flash memory is used. The thin (8 nm) tunnel oxides and high internal on-chip voltages (18-20V) make radiation hardening NAND flash memories very challenging. Nevertheless, many useful space missions (LEO, some Mars missions, etc.) only require a reduced level of radiation tolerance, often less than 50 k rad. Therefore, it is possible to use conventional commercial NAND flash memory to achieve high storage density with low cost in severe service environments, such as outer space applications including GEO orbits and deep space trajectories.

SUMMARY

This document discusses the feasibility of using commercial high-density NAND flash memories for data storage in severe service environments, such as in outer space. In one embodiment, a flash memory component stores data in conjunction with a data scrubbing operation that selects one of multiple data scrubbing schemes according to exposure levels from the severe environment and according to desired reliability performance. The typical parameters used for selecting such scrubbing include radiation exposure from the space environment and program-erase cycles for the flash memory in terms of number of write cycles and/or erasure cycles experienced. For example, in one embodiment, the scrubbing operation includes selection of data storage according to an MLC (multi-level cell) mode of operation, or according to an E-SLC mode, or according to an SLC-IPR mode, such that any one of the three operating modes may be used. These scrubbing modes are described in greater detail below. In this way, scrubbing may be initiated in response to error rate reaching a predetermined value. In such a situation, the error rate may include effects from one or more of total radiation doses, program cycles, and data retention time. In another embodiment, a data device includes a memory having a plurality of memory cells configured to store data values in accordance with a predetermined rank modulation scheme. In another embodiment, a data device includes a memory having a plurality of memory cells configured to store data values in accordance with a predetermined rank modulation scheme and a memory controller that receives a current error count from an error decoder of the data device for one or more data operations of the flash memory device and selects an operating mode for data scrubbing in accordance with the received error count and a program cycles count.

This document begins with review of current issues in flash memory for severe environments. One issue for discussion relates to the reliability of such component parts under total ionizing dose (TID) and single event upset effects. In this disclosure, techniques directed to the first issue, TID, are provided. Compared with previous studies on TID effect for various kinds of NAND flash memories, e.g., 90 nm~25 nm single-level cells (SLC) for NAND flash memories, NAND flash memories of 25 nm multi-level cell (MLC), and the like, this disclosure discusses the system-level reliability that 16 nm MLC, one of the most cost-effective NAND flash memories on the market, can offer to SSDs in space. See, e.g., M. Bagatin et al., TID sensitivity of NAND flash memory building blocks, in IEEE T-NS, 2009; M. Kay et al., Using charge accumulation to improve the radiation tolerance of multi-Gb NAND flash memories, in IEEE T-NS, 2013; M. Bagatin et al., Sample-to-sample variability and bit errors induced by total dose in advanced NAND flash memories, in IEEE T-NS, 2014; and F. Irom et al., Scaling effects in highly scaled commercial nonvolatile flash memories, in IEEE Radiation Effects Data Workshop, 2012 (90 nm-25 nm); F. Irom et al., Scaling effects in highly scaled commercial nonvolatile flash memories, in IEEE Radiation Effects Data Workshop, 2012 (25 nm MLC).

Measurements show that blocks that carried less than 3000 program/erase cycles (PECs) only survived up to approximately 10000 rad total doses under the protection of standard ECCs. The errors at the levels of threshold voltage $V_T$, cell logical state, and binary bit, respectively, are discussed, as well as error mitigation schemes for reliability enhancement. A relatively new data representation called Rank Modulation [see, e.g., A. Jiang et al., Rank modulation for flash memories, in *IEEE T-IT,* 2009] is described below, where data are read using the relative order of cell voltages. In experiments, the new representation as disclosed herein reduced bit errors by 60% on average. A novel memory scrubbing (MS) scheme is proposed that can refresh cells without block erasure and can operate under lower voltage. Measurements show that flash blocks survived up to 8000 PECs and 57000 rad total doses using the new scrubbing scheme. Both schemes were implemented as parts of a flash memory controller, and significantly outperform existing methods in various aspects.

Discussed herein is a system for error mitigation in NAND flash memory suitable for severe service environments, such as outer space applications including GEO orbits and deep space trajectories. The system discussion includes reporting results of a study of flash memory component parts with a system-level reliability of 16 nm MLC NAND flash memories under total ionizing dose (TID) effect. TID exposure is measured in units of rads. Errors that occur in the parts under TID effect are characterized at multiple levels. Results show that faithful data recovery typically is obtained up to a TID of approximately 9 k rad. Data errors observed in irradiated flash samples are strongly asymmetric. To improve the reliability of the parts, error mitigation methods were studied that consider the specific properties of TID errors. First, a novel data representation scheme is implemented that stores data using the relative order of cell voltages. The representation is more robust against uniform asymmetric threshold voltage shift of floating gates. Experimental results show that the scheme reduces errors at least by 50% for blocks with less than 3 k program/erase cycles and 10 k rad of TID. Second, empirical evaluations of memory scrubbing schemes are performed. Based on the results, a scheme is identified that refreshes cells without doing block erasure. Evaluation results show that parts under this scrubbing scheme survive up to 8 k PECs and 57 k rad total doses (TID).

Other features and advantages of the present invention should be apparent from the following description of exemplary embodiments, which illustrate, by way of example, aspects of the invention.

BRIEF DESCRIPTION OF THE DRAWINGS

FIG. 6(a) is a diagram that illustrates bit error analysis, wherein each block contains 128 lower pages and 128 upper pages; (a) shows RBERs of lower and upper pages at different PECs and total doses.

FIG. 6(b) is a diagram that illustrates bit error analysis, wherein each block contains 128 lower pages and 128 upper pages; (b) shows number of 0→1 and 1→0 bit errors in lower pages.

FIG. 6(c) is a diagram that illustrates bit error analysis, wherein each block contains 128 lower pages and 128 upper pages; (c) shows number of 0→1 and 1→0 bit errors in upper pages.

DETAILED DESCRIPTION

I. Introduction

Figure 1:
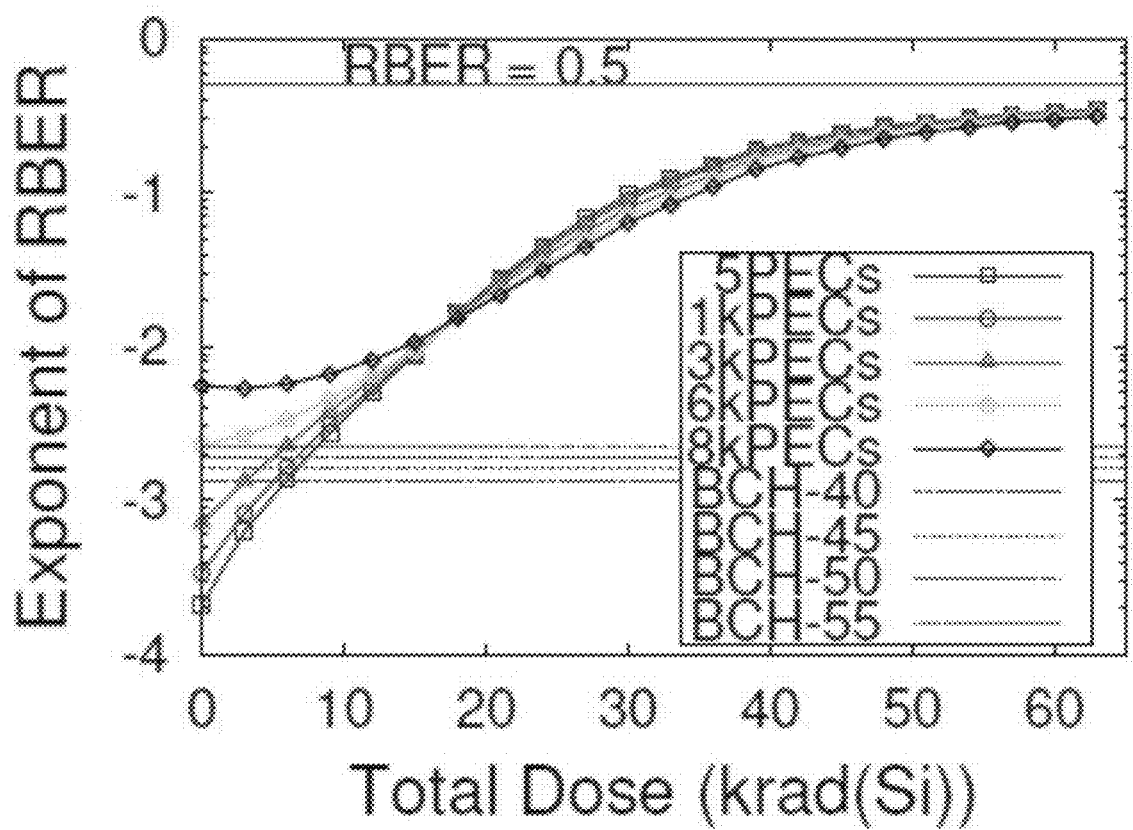
FIG. 1 is a diagram that shows RBERs of blocks with different PECs under TID effect, with error correction limits of different BCH codes for achieving 1e-15 LIBER, and all the codes have 1 KB block length, and correct 40, 45, 50 and 55 bit errors, respectively.

The reliability of commercial NAND flash memory decreases exponentially as density increases. NAND flash memory stores data by programming memory cells to different charge levels. As feature size shrinks, memory cells carry less charges, and their charge levels are more sensitive to both internal and external noise such as interference, charge leakage and radiation. This disclosure discusses the radiation reliability of 16 nm commercial NAND flash memory, which is one of the most dense and cost-effective configurations of NAND flash memory currently on the market. One issue of interest is to investigate how these parts behave under total ionization dose (TID) and single-event upset (SEU) effects. In outer space applications, such as in satellites and spacecraft, these effects correspond to accumulative background radiation and strikes from high energy ionizing particles. Further below, results obtained on TID effect are reported. The SEU effects are not discussed herein.

TID effect has recently been studied for NAND flash memories with lower densities, e.g. 90 nm-25 nm single-level cell (SLC) [see, e.g., M. Bagatin et al., in *IEEE T-NS*, 56(4):1909-1913, August 2009; M. Kay et al., in *IEEE T-NS*, 60(6):4214-4219, December 2013; see also M. Bagatin et al., in *IEEE T-NS*, 61(6):2889-2895, December 2014; and see F. Irom et al., in *IEEE Radiation Effects Data Workshop*, pages 1-6, July 2012], and 25 nm multi-level cell (MLC) [see, e.g., F. Irom et al., in *IEEE Radiation Effects Data Workshop*, pages 1-6, July 2012]. Discussed herein is a novel investigation of system-level reliability of 16 nm NAND flash memory. Provided is a quantitative study on the properties of errors at multiple levels during irradiation. Based on the study, effective error mitigation methods for reliability enhancement are implemented.

More particularly, discussed herein are topics including:

1. Characterizing $V_t$ shift bit error, and cell state error of the parts under TID effect. Results show that errors at all levels show strong asymmetry. Faithful data recovery only lasts until approximately 9 k rad, when typical configurations of error correcting codes (ECC) are used. ECC decoding failures due to $V_t$ shift in floating gates (FGs) occur much earlier than failures of peripheral circuits.
2. Design and implementation of a novel system using a data representation called rank modulation [see, e.g., A. Jiang et al., *IEEE T-IT*, 55(6):2659-2673, June 2009].

The scheme represents data using the relative order of cell voltages in memory, and provides higher reliability against uniform asymmetric $V_t$ shifts. Results show that the scheme reduces bit errors at least by 50% for blocks with less than 10 k rad and 3 k PECs.

3. Empirical evaluation of three memory scrubbing (MS) methods. Based on the results, an MS scheme is identified that refreshes cells without block erasure. Under this scheme, the parts survived up to 8 k PECs and 57 k rad, which outperforms the other two schemes in different aspects. The MS scheme is capable of multiple enhancements, which are also described.

II. Methodology

In the studies discussed herein, 16 nm 64 Gb planar MLC NAND flash from a major vendor was used, with a specified endurance of 3 k PECs. The parts were operated using an FPGA based tester. The $^{60}$Co γ radiation source at NASA JPL was used for TID effect. The parts were first program-erase cycled to various PECs. Random test data was then stored in selected blocks, and the parts were irradiated at a dose rate of 9 rad/s. The blocks were read periodically, and output data were compared with input data for error analysis.

In conjunction with the studies, this document discusses the feasibility of using commercial high-density NAND flash memories for storage in space, and in particular, the reliability of such parts under total ionizing dose (TID). Compared with previous studies on TID effect for various kinds of NAND flash memories, e.g., 90 nm-25 nm single-level cells (SLC) for NAND flash memories [See, e.g., M. Bagatin et al., TID sensitivity of NAND flash memory building blocks, in IEEE T-NS, 2009; M. Kay et al., Using charge accumulation to improve the radiation tolerance of multi-Gb NAND flash memories, IEEE T-NS, 2013; M. Bagatin et al., Sample-to-sample variability and bit errors induced by total dose in advanced NAND flash memories, in IEEE T-NS, 2014; and F. Irom et al., Scaling effects in highly scaled commercial nonvolatile flash memories, in IEEE Radiation Effects Data Workshop, 2012]; and NAND flash memories of 25 nm multi-level cell (MLC) [F. Irom et al., Scaling effects in highly scaled commercial nonvolatile flash memories, in IEEE Radiation Effects Data Workshop, 2012], and the like, this disclosure discusses the system-level reliability that 16 nm MLC, one of the most cost-effective NAND flash memories on the market, can offer to SSDs in space. Measurements show that blocks that carried less than 3000 program/erase cycles (PECs) only survived up to approximately 10000 rad total doses under the protection of standard ECCs. The errors at the levels of threshold voltage $V_T$, cell logical state, and binary bit, respectively, are discussed, as well as error mitigation schemes for reliability enhancement. A relatively new data representation called Rank Modulation [see, e.g., A. Jiang et al. Rank modulation for flash memories, in *IEEE T-IT,* 2009] is described below, where data are read using the relative order of cell voltages. Using rank modulation (RM) to store the data is an optional feature of the data storage memory system described herein. In experiments, the new RM representation as disclosed herein reduced bit errors by 60% on average. A novel memory scrubbing (MS) scheme is proposed that refreshes cells without block erasure and operates under lower voltage. Measurements show that flash blocks survived up to 8000 PECs and 57000 rad total doses using the new scrubbing scheme. Both schemes were implemented as parts of a flash controller, and significantly outperform existing methods in various aspects.

A. Experimental Setup

In the experimental setup, 16 nm planar MLC NAND flash memory manufactured by a major flash vendor was used. Each package contained one die with total capacity of 64 Gb and specified lifetime of 3 k PECs. A die for a memory device generally contains two planes, with each plane having 1024 blocks. A block contains 256 pages, with page size being 16 KB. The peripheral circuits mainly include charge pumps used for page reading, page programming, and block erasure, row decoders for page addressing, as well as control logic. The parts typically comply with the ONFI standard [Open NAND flash interface; see, e.g., http://www.onfi.org.2016].

Figure 2:
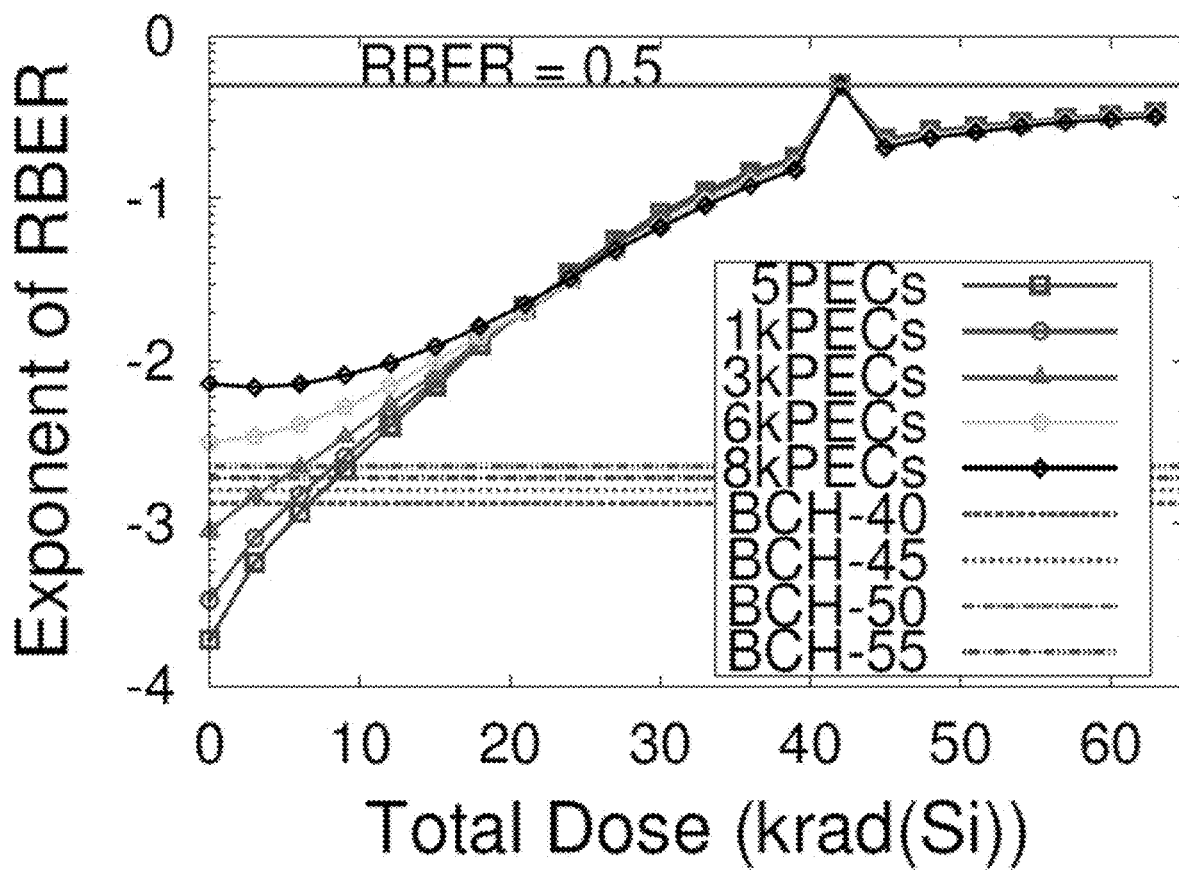
FIG. 2 is a diagram that shows RBERs of a part whose row decoder failed at 40K rad.

The flash packages were operated using a commercial NAND flash tester, such as a NAND flash memory tester called "SigNASII" (see, e.g., the Web page at http://www.siglead.com/eng/innovationsignas2.html; available from the Internet as of 2014) shown in FIG. 2. The tester uses an FPGA as its controller, and connects up to two daughter boards with each carrying two sockets where NAND flash packages are inserted. Flash characterization and error mitigation methods as described in this work were implemented as software on host PC, and communicated with the tester via a USB interface.

Irradiation experiments were carried out at Shepard Co-60 High Dose Rate TID Center at the Jet Propulsion Laboratory. In the experiments, the parts were removed from the testers and relocated to a chamber for irradiation. After irradiation, the parts were returned to the tester for measurements.

B. Testing Procedures

To characterize the parts under TID, randomly selected blocks were first program-erase cycled up to 8 k PECs. This process degrades the blocks to different stages of their lifetime. Next, pseudo-random test data was stored in the blocks. Pages in a block were programmed sequentially (i.e. page 0, 1, . . . , 255) as recommended by the vendor for reducing programming interference. After the test data were written, the blocks were immediately read. Both the binary output data and the $V_t$ distributions of the blocks were saved. The parts were then irradiated up to 63 k rad at dose rate of 9 rad/s. The irradiation was carried out at room temperature, and all the parts were unbiased. In this process, the blocks were read and their $V_t$ distributions were measured whenever an additional 3 k rad were received. After irradiation, all the collected output data were compared with the test data regenerated from the saved seeds for error analysis. The $V_t$ distributions measured during irradiation were compared with the initial distributions for understanding the errors observed in the output data.

III. Characterization Results

This section reports the results of NAND flash characterization. First discussed is the overall raw bit error rates (RBERs) of the parts under TID effect, and their lifetime is determined under typical ECC configurations used by commodity solid-state drives (SSDs). Shielding test results are then described that identify the major source of errors. Finally, the properties of $V_t$ distribution shifts, bit errors, and cell state errors are analyzed, and the strong asymmetry observed in errors at all levels is discussed. The purpose of the characterizations is to obtain deeper understandings on the properties of errors, which facilitate the design of more effective error mitigation schemes, as described herein.

A. Overall Raw Bit Error Rate

FIG. 1 shows bit error rates for memory exposed to various levels of radiation, such as might be expected in a severe operating environment, such as outer space. FIG. 1 shows that the raw bit error rates (RBER, the ratio between total number of bit errors and total number of bits in a block) of blocks that carried 5, 1 k, 3 k, 6 k, and 8 k PECs, increase by 1647×, 1017×, 463×, 141×, and 55× at 63 k rad, respectively. That is, FIG. 1 shows that the overall RBERs (defined by the ratio between the number of bit errors and total number of bits in a block.) of the blocks under TID effect. These performance numbers (FIG. 1) are for memory that is operated without active deployment of the features disclosed herein. Compared to the RBERs measured at 0 rad, the RBERs of the blocks that carried 5, 1 k, 3 k, 6 k, and 8 k PECs increased by 1647×, 1017×, 463×, 141×, and 55× at 63 k rad, respectively. The lowest curve in FIG. 1 at the origin (0, −4) has the square line (blue), the next curve has the circle line (red), the next highest curve has the triangle line (green), next is the circle line (yellow), and lastly is the diamond line (black).

The errors observed above were mainly due to the interference of page programming and TID effect. Programming interference increases the voltages of neighboring cells when a cell is being programmed due to capacitance coupling. TID effect changes the threshold voltage of an FG in two ways [see, e.g., S. Gerardin et al., *IEEE T-NS*, 60(3): 1953-1969, June 2013]. First, irradiation breaks charge-hole pairs in tunnel oxides. When FG stores charges (in this case, the cell has positive threshold voltage), some of the detached holes will be pulled into the FG due to the electric field created by the charges in the FG. The injected holes recombine with the charges in FG, and thus reduce cell voltage. Similarly, when FG stores holes (the cell is at erased state and has negative threshold voltage), charges in the tunnel oxide are pulled into FGs to recombine with the holes after irradiation. Such recombination shifts cell threshold voltage towards neutralized state. Second, irradiation causes photoemission, which dissipates charges or holes carried by FGs. The TID errors in the parts are almost due to the downward shift of cell voltages. This is because only FGs that are at the erased state store holes, having negative threshold voltages. The reference threshold voltages (RTVs) for distinguishing cells at the erased state and other states are always positive, while FGs having negative voltages can never be shifted to positive values under TID effect. Therefore, upward voltage shifts of erased FGs do not introduce errors on data.

After approximately 18 k rad, the blocks with more PECs have lower RBERs than the blocks with less PECs. This is because errors due to write interference dominate at lower doses, and radiation errors dominate at higher doses. For cells that are not at the erased state, programming interference and TID effect shift their threshold voltages towards opposite directions, and cells carried higher PECs have more programming errors "corrected" by radiation.

When total dose exceeds 18 k rad, the blocks that previously carried more PECs have lower RBERs than the ones with less PECs. This is because errors due to write interference dominate at lower doses, and radiation errors dominate at higher doses. As programming interference and TID effect shift $V_T$ towards opposite directions, cells carried higher PECs have more programming errors "corrected" by radiation. With reference once again to FIG. 1, it can be seen that with standard BCH ECC configurations, the blocks can only survive up to approximately 10 k rad, such that data are recoverable using ECC and the standard $10^{-15}$ uncorrectable bit error rate (LIBER) is reached. See, e.g., N. Mielke et al., Bit error rate in NAND flash memories, in *IEEE IRPS*, 2008. Programming, erasing, and addressing failures started occurring at approximately 42 k rad. The first two kinds of failures continued until the end of irradiation, while addressing failures were temporary. FIG. 1 shows that the RBERs of the parts with shielded floating gate (FG) arrays are only 22% higher on average at 50 k rad than at 25 k rad, and the difference becomes 358% for the parts with shielded peripheral circuits. This observation indicates that FGs are the major error sources among all the components of a die.

TID effect also degrades the quality of peripheral circuits. See, e.g., M. Bagatin et al., in 2008 *European Conference on Radiation and Its Effects on Components and Systems*, pages 34-39, September 2008. Irradiation makes charge pumps generate lower than normal voltages, leading to underprogramming error, and incomplete block erasure. The degradation of row decoders causes misaddressing, leading to large number of bit errors due to incorrect reading address. In the experiments, it was observed that programming, erasure and addressing starts failing at 42 k rad. Programming and erasure failures continuously occurred, while addressing failures were temporary. FIG. 2 shows an example of row decoder failure at 40 k rad.

B. Lifetime Under Error Correcting Code

The lifetime of a block under TID effect is determined as the largest total dose when its RBER increases above the correction limit of ECC. The correction limit of an ECC is the maximal RBER that makes uncorrectable bit error rate stay below 1e-15 as required by industry standard. See, e.g., N. Mielke et al., In *IEEE IRPS*, pages 9-19, April 2008. UBER measures the bit error rate after ECC decoding, and can be calculated as $$\left(\sum_{i=t+1}^{N} \binom{N}{i} r^i (1-r)^{N-i}\right)/N,$$

where r is the current RBER, t is the number of bit errors that the ECC corrects, and N is the codeword length used.

FIG. 1 showing the RBERs also plots the correction limits of four Bose-Chaudhuri-Hocquenghem (BCH) codes which have code length 1 KB and correct 40, 45, 50, and 55 bit errors, respectively. BCH code is one of the dominant ECCs used in commodity SSDs as it allows efficient hardware implementation, low redundancy, and good error correction capability. The BCH configurations in FIG. 1 are typical for SSDs, where high code rates (the ratio between the number of information bit and codeword length) are desired. For instance, the BCH codes that correct 40 bit errors have code rate 0.935, and they are recommended by the vendor of the parts. Comparisons between the correction limits and the RBERs of the block show that reliable data recovery only lasted up till 9 k rad. For instance, under the 40-bit BCH code the data of the blocks that carried only 5 PECs could be recovered until 6 k rad while meeting the requirement on UBER, and data recovery failed at 3 k rad for blocks that carried 3 k PECs.

C. Shielding Test

As errors introduced during irradiation are due to the degradation of FGs and peripheral circuits, it is important to understand how each source contributes to the errors. Therefore, shielding tests were conducted to characterize the RBERs of the parts with different components being shielded separately during irradiation.

Specifically, eight parts were divided into two groups of the same size. The FG arrays of each part in the first group were shielded, and then the peripheral circuits of each part in the second group were shielded. A standard 3.625 inch thick lead brick was used, which shields 100% of radiation, theoretically. The boundary between peripheral circuits and FG arrays was determined using the decapsulated part in FIG. 1. Both groups were first irradiated to 25 k rad, and then to 50 k rad.

Figure 3:
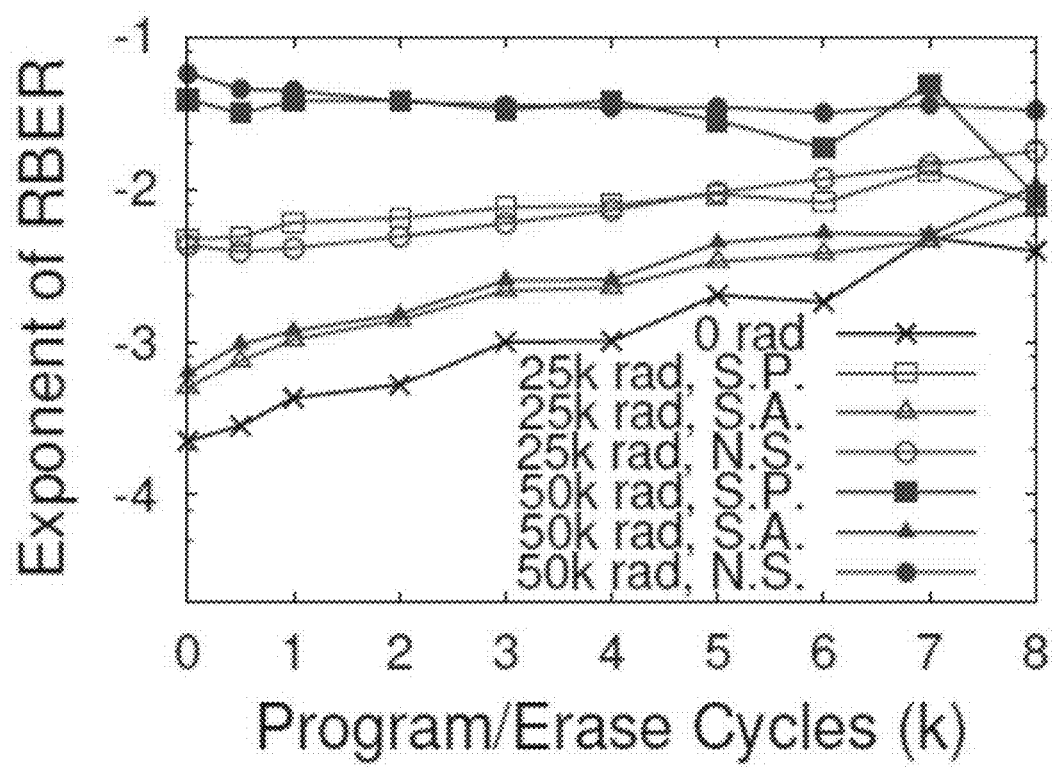
FIG. 3 is a diagram that shows RBERs of blocks from the parts with different components being shielded, wherein S.P. means: shield peripheral circuits; S.A. means: shield FG arrays, and N. S. means: no shielding.

FIG. 3 compares the RBERs of the shielded parts with the RBERs of unshielded parts and the RBERs of unirradiated parts. At both 25 k rad and 50 k rad, the RBERs of the parts with peripheral circuits being shielded are close to those of the unshielded parts. The RBERs of the parts with FG arrays being shielded are the closest to those of the unirradiated parts. The RBERs of the parts with FG arrays being shielded are only 22% higher on average at 50 k rad than at 25 k rad, and the difference becomes 358% for the parts with shielded peripheral circuits. These observations all indicate that the degraded FG arrays are the dominant sources of errors.

D. $V_t$ distribution

The threshold voltages of FGs are shifted due to TID effects. MLC NAND flash memory uses four logical cell states to store two bits in each FG. Each state corresponds to a different level of threshold voltages, and is read by comparing cell voltage with predetermined RTVs. The logical states are referred to as P0, P1, P2 and P3, with P0 being the erased state, and P3 being the state with the highest voltage in average. Per the discussion above in Subsection A, "Overall raw bit error rate", most of the cells at state P0 have negative voltages, and thus will be shifted to higher values. The threshold voltages of the cells in the other three states will be shifted to lower values. The state of a cell changes when its threshold voltage is shifted across predetermined RTVs.

Figure 4:
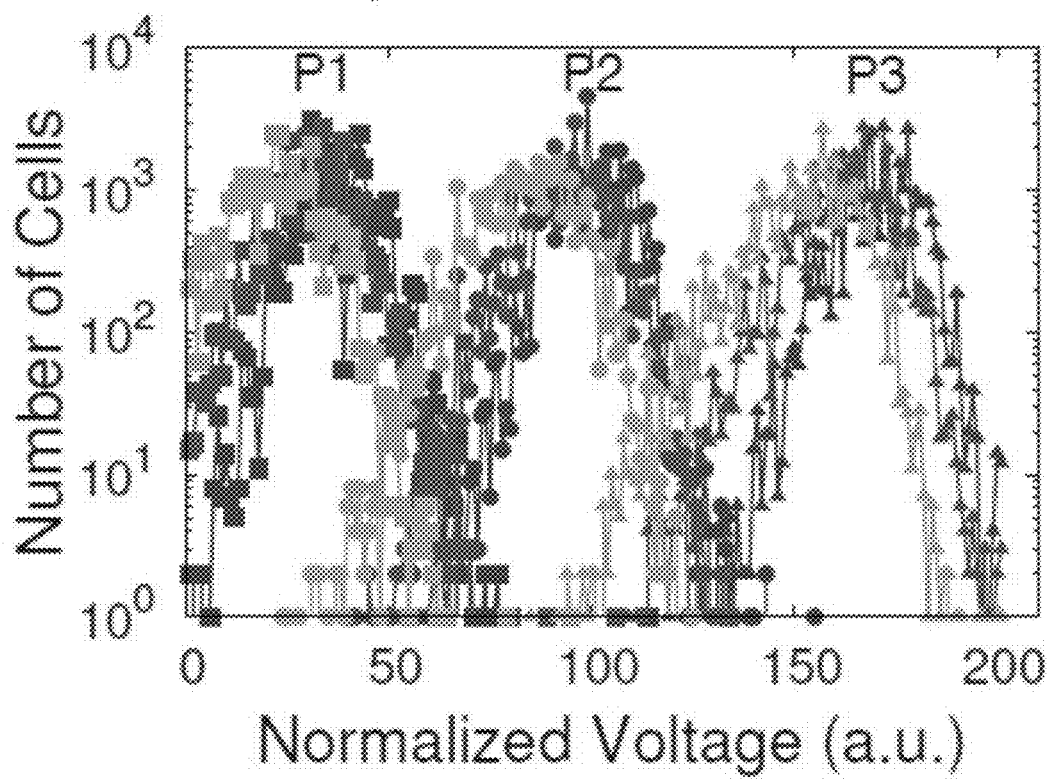
FIG. 4 is a diagram that shows $V_T$ distributions of logical states P1, P2, and P3 at different total doses, wherein connected triangle line (blue) shows before irradiation, connected square line (red) shows after 24 k rad, and connected dot line (green) shows after 48 k rad.

FIG. 4 shows the $V_t$ distributions of the cells in states P1, P2, and P3 before irradiation, after 24 k rad, and after 48 k rad, respectively. The cells were from the same wordline in the middle of a flash block, and each distribution was measured by reading the cells multiple times with different RTVs. The $V_t$ distributions of all three states kept shifting towards lower positions. The $V_t$ distribution of state P0 was not measured due to its negative mean voltage. A significant portion of cells at states P2 and P3 (belonging to the left tails of their distributions) shifted to the central region of state P1 and P2 after 48 k rad, leading to the high RBERs observed in FIG. 1. The amount of cell voltage shift is proportional to its initial voltage before irradiation. For instance, among all the distributions, the distribution of state P3 had the largest shift, and that of state P1 had the smallest shift. This is because a cell with higher initial voltage creates larger electric field, which pulls more holes from the tunnel oxide into the FG to recombine with the stored charges.

FIG. 4 shows that the $V_t$ distributions of logical states P1, P2, and P3 shift asymmetrically towards lower positions during irradiation. That is, the erased state P0 was not measured due to its negative mean voltage. Charge traps in tunnel oxide and photoemission both introduced by radiation cause charge losses in FGs. See, e.g., S. Gerardin et al., Radiation effects in flash memories, in *IEEE T-NS*, 2013. Cells with higher $V_T$ are more vulnerable to charge loss.

E. Error on Cell State

The patterns of cell state errors caused by the $V_t$ shift were analyzed. In MLC NAND flash memory, the logical states of the cells in a physical page are determined by the bits from input lower page and upper page. A lower (an upper) page contains the LSB (MSB) to be stored in each cell. A pair of LSB (MSB) is mapped to a logical state following the Gray code mapping: (1, 1)↔P0, (0, 1)↔P1, (0, 0) ↔P2 and (1, 0)↔P3. The cell states were computed before and after irradiation, and compared for analysis.

Figure 5A:
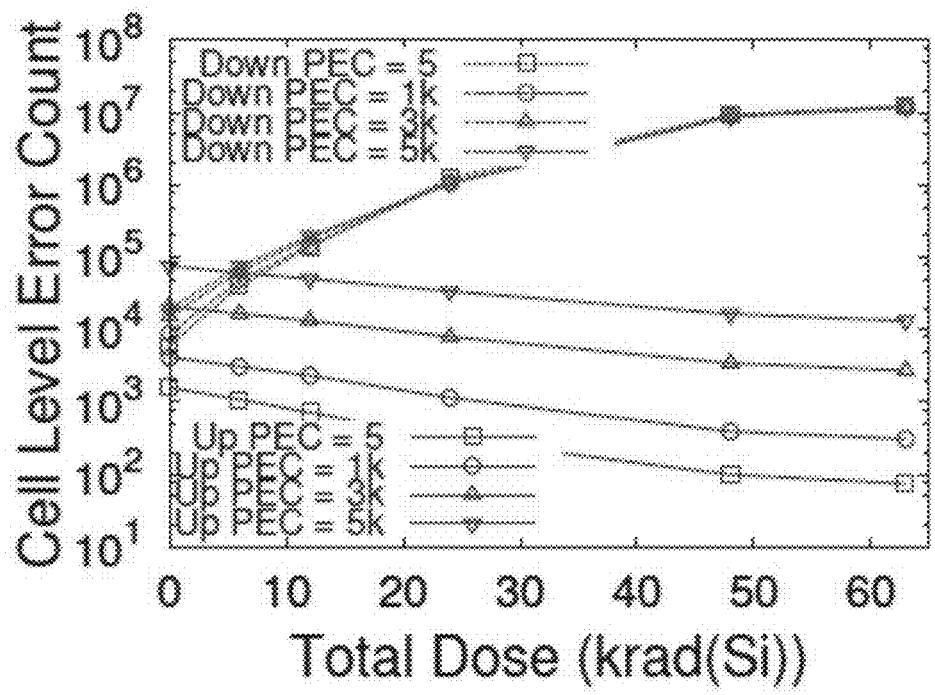
FIG. 5(a) is a diagram that illustrates the number of upward and downward cell state errors in blocks that carried different PECs for a cell logical state error analysis; the capacity of each block is 4 MB.
Figure 5B:
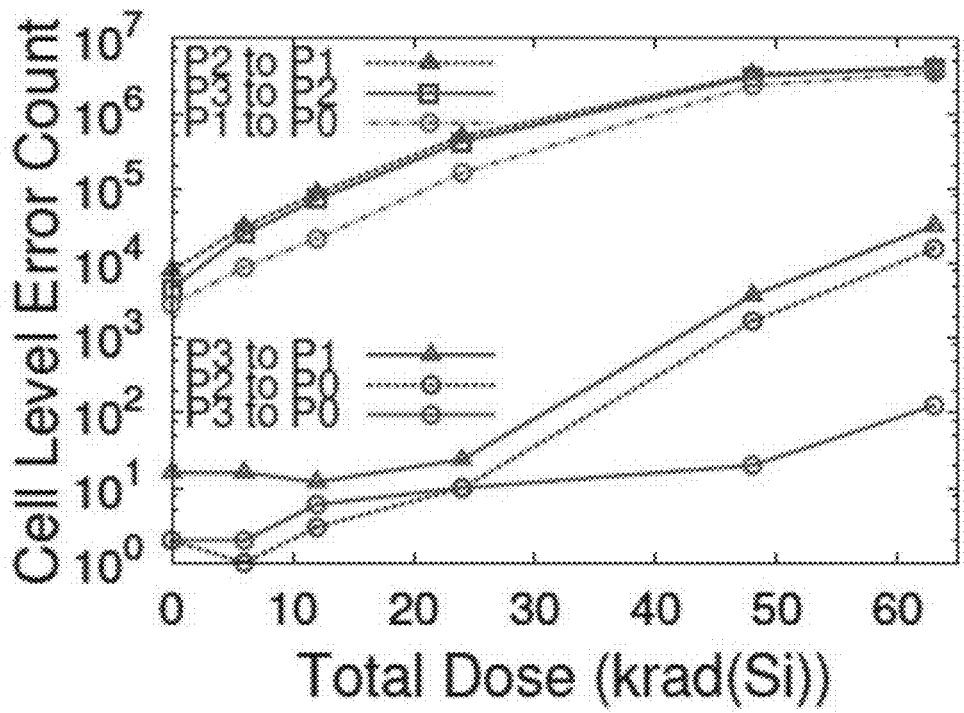
FIG. 5(b) is a diagram that illustrates the number of different downward cell state errors in a block that carried 3 k PECs for a cell logical state error analysis; the capacity of each block is 4 MB.

FIG. 5(*a*) shows that downward state errors (which makes cell state move from PX to PY, where X>Y) and downward state errors for blocks occur at different PECs and different total doses. Generally, downward errors started dominating at 6 k rad. For instance, at 12 k rad there are 3× to 193× more downward state errors than upward state errors. The number of upward errors gradually gradually decrease as total dose increases due to radiation-induced charge loss. FIG. 5(*b*) shows that adjacent state transitions are the major state error patterns whose number is up to $2.5\times10^4$ times higher than that of non-adjacent state errors on average. The two bits (lower and upper bits) mapped from the state of each cell are distributed into paired lower and upper pages.

Returning to FIG. 5(*a*), the drawing shows that the numbers of upward (which makes cell state change from PX to PY, where X<Y) and downward state errors for blocks occur at different PECs and total doses. Downward errors started dominating at 6 k rad. For example, at 12 k rad, there are 3× to 193× more downward state errors than upward errors. The number of upward errors gradually decrease as total dose increases, due to radiation-induced charge loss.

FIG. 5(*b*) shows that adjacent state transitions (state move from PX to PY, where |X−Y|=1) are the major state error patterns whose number is up to $2.5\times10^4$ times higher than that of non-adjacent state errors on average. There are more P2→P1 and P3→P2 errors than P1→P0 errors due to the larger voltage shifts of the cells in states P2 and P3.

F. Bit Error

Bit errors displayed strong asymmetry. FIG. 6(*a*) shows the average RBERs of upper page and lower page under TID effect. The RBERs of upper page is higher than those of lower pages by 22%-41% on average. This is explained using the Gray code mapping between cell states and binary bits. The errors in MSB s/upper page are mainly due to the state errors that cause P3→P2 and P1→P0 state transitions. The errors in lower bits are mainly due to the state errors that cause P2→P1 state transitions. According to the measurement in FIG. 5(*b*), upper pages thus have higher RBERs. Therefore, the RBERs of upper pages shall be used as the worst case for determining the ECC correction capability in practice.

FIG. 6(*b*) and FIG. 6(*c*) analyze the patterns of bit errors in lower pages and upper pages, respectively. At higher doses, bit errors are asymmetric in lower pages, containing significantly more 0→1 errors than 1→0 errors. This is because downward cell state errors dominates at higher doses, and downward errors causes 0→1 errors in lower pages. Bit errors in upper pages are more symmetric than those of lower pages. In upper pages, 1→0 bit errors are caused by P3→P2 state errors, and 0→1 bit errors are caused by P1→P0 state errors. Following the results of FIG. 5(*b*), the number of 0→1 errors are thus approaching that of 1→0 errors at higher total doses as shown in FIG. 6(*c*).

More particularly, FIG. 6(*a*) shows that the RBER of upper pages is higher than that of lower pages by 22%~41% on average. Therefore, upper pages shall be used as the worst case for determining the correction capability of ECC. At higher doses, bit errors are asymmetric in lower pages. Note that FIG. 6(*b*) contains much more 0→1 errors than 1→0 errors, and note that FIG. 6(*c*) is more symmetric in the upper pages.

IV. Error Mitigation

The error characterization above shows that peripheral circuits still function at lower total doses, and errors under TID effect are due to uniform asymmetric voltage shift. In this section are discussed two effective error mitigation methods, namely rank modulation (RM) coding and memory scrubbing (MS), which take advantage of the aspects above to improve the lifetime of flash memory under TID effect.

A. Rank Modulation Implementation

In view of the asymmetric VT shifts, the rank modulation (RM) coding scheme was applied in the hope of achieving error mitigation. See, e.g., A. Jiang et al., Rank modulation for flash memories, in *IEEE T-IT,* 2009. Different from using quantized voltage levels for data representation in current flash, in RM, data are represented using the relative order of cell voltages. This new scheme for representation of data provides higher reliability to flash under TID as the order of cell voltages largely remains when asymmetric VT shifts occur.

Figure 7:
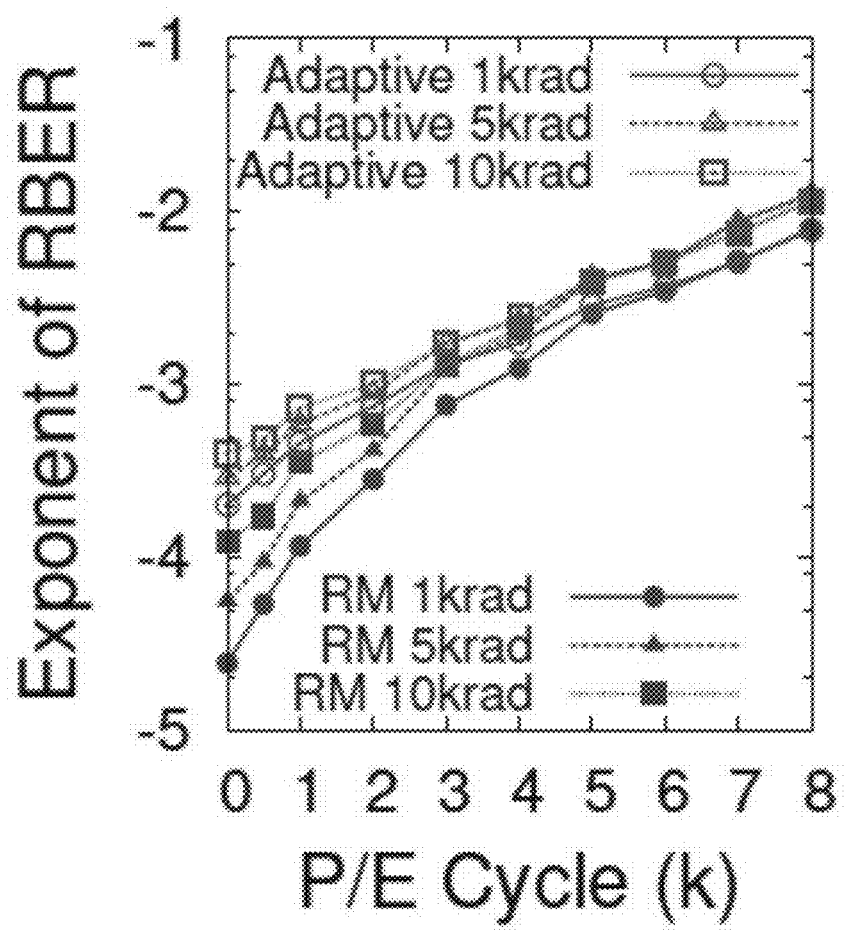
FIG. 7 is a diagram that shows RBERs of reading using RM versus RBERs of reading using adaptive reference voltages.

FIG. 7 shows that for blocks with PEC≤3 k reading using RM yields 70%, 61% and 50% less RBERs at 1 k, 5 k, and 10 k rad, respectively, compared to reading using adaptive reference threshold voltages recommended by the flash vendor.

RM provides a novel data representation for reducing errors caused by asymmetric $V_t$ shifts in NAND flash memory. See, e.g., A. Jiang et al., in *IEEE T-IT,* 55(6):2659-2673, June 2009. Different from using quantized voltage levels for data representation in current flash, in RM, data are represented using the relative order of cell voltages. The new representation provides higher reliability to flash under TID as the order of cell voltages largely remains when asymmetric $V_t$ shifts occur.

An adapted version of the typical RM scheme was implemented. In the adapted implementation, cells of a physical page are divided into groups of equal size. User input data are first used to determine the state of each cell. Then each cell is assigned a rank, which simply equals to the index of the cell state. Consequently, cells with lower ranks have lower threshold voltages. Furthermore, metadata is generated for each group that records the number of cells in each rank. After which, both user data and metadata are stored together in the cells on the same physical page. Data are read by sorting the cells in a group by approximated voltage, and assigning ranks following the sorted order. Cell voltages are approximated by reading with different RTVs. These RTVs split the whole range of threshold voltage into multiple bins. The results of the multiple reads are combined to determine the bin of each cell, where the index of a bin provides an estimation on cell threshold voltage. For each group, the cells are sorted by bin index, and ranks are assigned to cells following the sorted order. The number of cells to be assigned in each rank is given by the previously stored metadata. Details of the RM technique may be readily found, for example, in Y. Li et al., in *IEEE IRPS,* April 2016, which provides a detailed description of the implementation herein, and provides experimental results for understanding.

FIG. 7 shows that, for blocks with PEC 3 k, reading using RM yields 70%, 61%, and 50% less RBERs at 1 k, 5 k, and 10 k rad, respectively, compared to reading using adaptive reference threshold voltages. The latter is a scheme that is recommended by the vendor, which shifts the reference threshold voltages to lower values when cell voltage shift. In this experiment, each RM group had 512 cells with each cell storing 1.97 bits on average (0.03 bit less than the uncoded control scheme). Four RTVs were used between every two adjacent distributions, for measuring the estimated cell voltages. The results of the control scheme selected the minimum RBERs from eight reads using different RTVs between two adjacent distributions. The values of RTVs are supplied by the vendor. The reliability gain of RM becomes smaller as PEC increases. When cells are being worn out, process variation is amplified due to the increased number of charges that are trapped inside tunnel oxide. High variation implies that cell voltage shifts under TID effect are less uniform. This increases the probability that cells of higher ranks have lower voltages than cells of lower ranks after irradiation. The increased output rank switches thus introduce more bit errors to output data.

B. Memory Scrubbing

To further improve the lifetime of flash memory under TID effect, an MS technique was implemented for flash, to keep RBER constantly below the correction limit of ECC. See, e.g., M. Bagatin et al., in *IEEE T-NS,* 56(4):1909-1913, August 2009; see F. Irom et al., in *IEEE Radiation Effects Data Workshop,* pages 1-6, July 2012; and see H. Schmidt et al., in *IEEE T-NS,* 56(4):1937-1940, August 2009. Conventional MS schemes periodically read data, correct errors using ECC, erase the blocks, and write the corrected data back to the blocks. See, e.g., F. Irom et al., in *IEEE Radiation Effects Data Workshop,* pages 1-6, July 2012; and see H. Schmidt et al., in *IEEE T-NS,* 56(4):1937-1940, August 2009. Therefore, cells that lose charges due to irradiation will be recharged after scrubbing. In this way, scrubbing may be initiated in response to error rate, which may include error caused by one or more of total exposure instances to radiation, number of program cycles, and data retention time.

An empirical study was conducted of three different MS schemes referred as MLC-MS, E-SLC-MS, and SLC-IPR-MS. These are multi-level cell memory scrubbing, enhanced single level cell memory scrubbing, and single level cell in-place rewriting memory scrubbing, respectively. For the first two schemes, all the pages are programmed for storing data. MLC-MS writes data using conventional sequential MLC programming, in which cells are configured to have one of four voltage (charge) levels, the levels denoted as P0, P1, P2, and P3. E-SLC-MS only uses states P0 and P3 of a cell to store one bit data, with the two states representing bits "1" and "0", respectively. Therefore, E-SLC-MS provides higher reliability but lower capacity, thanks to the large voltage gap between the two states. During scrubbing, both schemes need to erase the blocks, and write back the corrected data, such as in a refresh operation. The process thus introduces one additional PEC to each block being used. For SLC-IPR-MS, only the lower pages of a block are written for storing data, and upper pages are never programmed. This way enables the single-level cell (SLC) mode which uses states P0 and P1$^+$ for storing bits "1" and "0", where state Pr is an intermediate state whose $V_T$ distribution is between those of P1 and P2. Moreover, it also allows the in-place rewriting (IPR) capability, i.e., a bit 1 in a lower page can be reprogrammed to 0 without first erasing the block. See, e.g., Y. Cai et al., in *IEEE ICCD,* pages 94-101, September 2012. Therefore, MS using IPR is able to correct the dominating 0→1 bit errors of lower pages without introducing additional PEC. Note that, the capacity of MLC NAND flash under E-SLC-MS and SLC-IPR-MS schemes will be reduced by 50%. Compared to the other two MS schemes, SLC-IPR-MS enables cells to a have lower voltage in average, due to the smaller voltage gap between states P0 and P1$^+$, and allows for fewer cells to be programmed during scrubbing.

In total, four parts of a memory were used in the evaluation, where the parts were scrubbed at the same time while being irradiated. For each part, twenty blocks were selected for evaluating each MS scheme. For each scheme, the blocks were divided into an experimental group and a control group. Both groups had equal size. The experimental group used MS on the blocks, and the control group only read data. Before irradiation, the ten blocks of each group were cycled to 5, 0.5 k, 1 k, 2 k, 3 k, 4 k, 5 k, 6 k, 7 k, and 8 k PECs, respectively. BCH code of length 1 KB correcting 55 bit errors was used as the ECC. For all MS and their control schemes, data in blocks were read and decode every 3 k rad. The RBERs were also recorded for each read. If the number of bit errors in any codeword of a block exceeds a predetermined scrubbing threshold that was set to 25 and is still less than 55, the whole block will be scrubbed.

Figure 8:
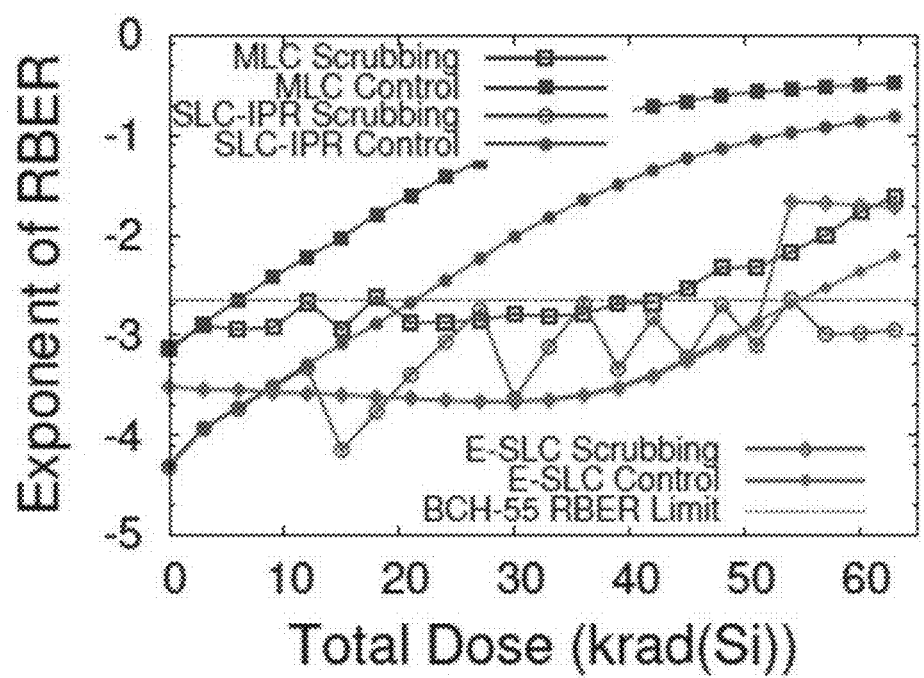
FIG. 8 is a diagram that shows RBERs of the blocks with and without using MS during irradiation.

FIG. 8 shows the RBERs of six blocks with 3 k PECs from the same package during irradiation. Among the blocks, three were scrubbed using different schemes. The results show that MLC-MS and SLC-IPR-MS schemes significantly improve the lifetime of flash memory under TID effect. The zigzag patterns shown in FIG. 8 indicate the triggering of scrubbing, after which RBERs started increasing again from low values. For E-SLC-MS, no triggering of scrubbing was observed in the experiment, as the RBERs were always below the predetermined scrubbing threshold thanks to the large voltage gap between the two cell states used. The RBERs of cells under E-SLC-MS quickly moved above the correction limit of ECC after 50 k rad due to possible peripheral circuit failures, and ECC decoding failure. Although the experimental results show that there is no difference between E-SLC-MS and its control case, it is still possible for E-SLC-MS to be beneficial if smaller scrubbing thresholds are used so that scrubbing can happen earlier before the failure of peripheral circuits.

Figure 9A:
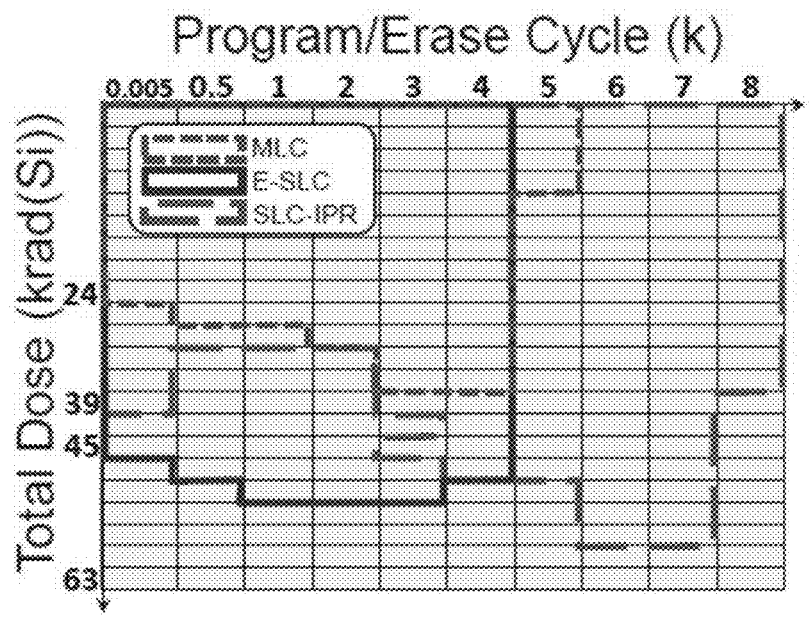
FIG. 9(a) is a diagram that shows survivable regions given by MS schemes.
Figure 9B:
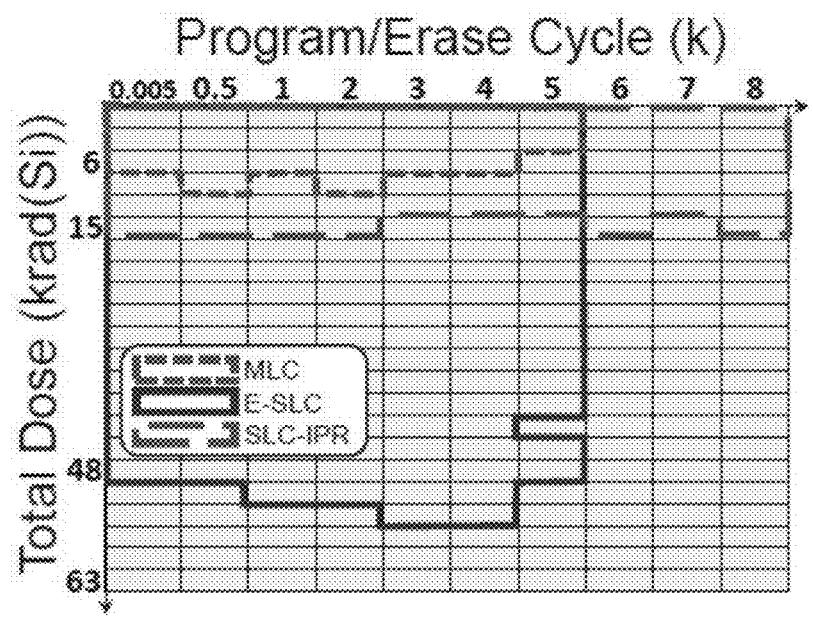
FIG. 9(b) is a diagram that shows survivable regions given by control schemes for the MS schemes of FIG. 9(a).

FIG. 9 shows the survivable regions (SRs) of the flash memories under different MS and their control schemes, respectively. SR measures the maximal total doses when the data stored in all the testing blocks with certain number of PECs from at least 3 (out of 4) packages can still be recovered by ECC. Based on the results, the SR of SLC-IPR-MS is 113% and 43% larger than those of MLC-MS and E-SLC-MS, respectively. The SR of SLC-IPR-MS reaches 57 k rad when scrubbing was still effective (FIG. 8). As the TID effect gradually degrades charge pumps, programming/erasure failures start occurring due to the lower voltage falsely supplied by charge pumps. See, e.g., Y. Li et al., in *IEEE IRPS*, April 2016. The scrubbing of SLC-IPR-MS does not need block erasure, which avoids errors caused by erasure failures. The in-place rewriting only programs the cells that have 0→1 bit errors. Therefore, much fewer cells need to be programmed during each scrubbing. Also considering the smaller voltage gap used during programming, the scrubbing operation of SLC-IPR-MS thus has higher success rate than those of the other schemes at higher total doses.

E-SLC-MS and its control scheme provide the highest reliability when blocks carry less than 4 k PECs. This is because the relatively large voltage gap between P0 and P3 used in E-SLC-MS takes much more doses of radiation to introduce state error as compared to the other schemes. The results in FIG. 8 further confirms the explanation, where the RBER growths of E-SLC-MS and its control scheme are much slower than those of the other schemes.

SLC-IPR-MS provides the highest reliability to blocks that carry 5 k-8 k PECs when almost all the blocks under the other two schemes immediately failed to decode even before irradiation. This observation is explained by comparing the programming errors of each scheme. Programming errors come from interference and charge over-injection. The amount of interference received by a victim cell depends on the average voltage increase of its neighboring cells, the latter is proportional to the voltage gap between cell states. Thus the programming of SLC-IPR-MS creates less interference than the other schemes. Charge over-injection is the phenomenon that additional charges are injected into FGs during programming due to leakage paths formed by the charges trapped in tunnel oxides. The amount of over-injection of an FG depends on the time duration of programming, and the number of PECs carried by the FG. In the experiments described herein, the blocks used for comparing different schemes have the same PECs, and the programming used by SLC-IPR-MS takes much less time thanks to the smaller voltage gap used. SLC-IPR-MS thus introduces less over-injection. Therefore, SLC-IPR-MS introduces less programming errors. This explanation is validated by the results of FIG. 12 where SLC-IPR-MS and its control schemes have the lowest RBERs at 0 rad. As over-injection errors grow with PECs, and the programming methods of MLC-MS and E-SLC-MS have higher over-injection errors, blocks under these two schemes thus suffer from more programming errors at higher PECs, and started having ECC decoding failures at earlier PECs than the blocks under SLC-IPR-MS.

In summary, the errors of 16 nm MLC NAND flash memory under TID effect have been characterized. Results have shown that the faithful data recovery only lasted until about 9 k rad under typical ECC configurations. FGs degraded by TID effect are the major sources of errors. Strong asymmetry of errors was observed at multiple levels, and RM and MS schemes which take advantage of the properties of TID errors for reliability enhancement were studied. Evaluation has shown that both error mitigation schemes significantly extended the lifetime of flash memory under TID effect. This work is the first step of efforts towards high density flash-based storage in space. In the next step, the behavior of high-density NAND flash under SEU effect as well as in low temperature environment will be studied, and more effective and practical error mitigation schemes will be developed.

V. Embodiments

Figure 10:
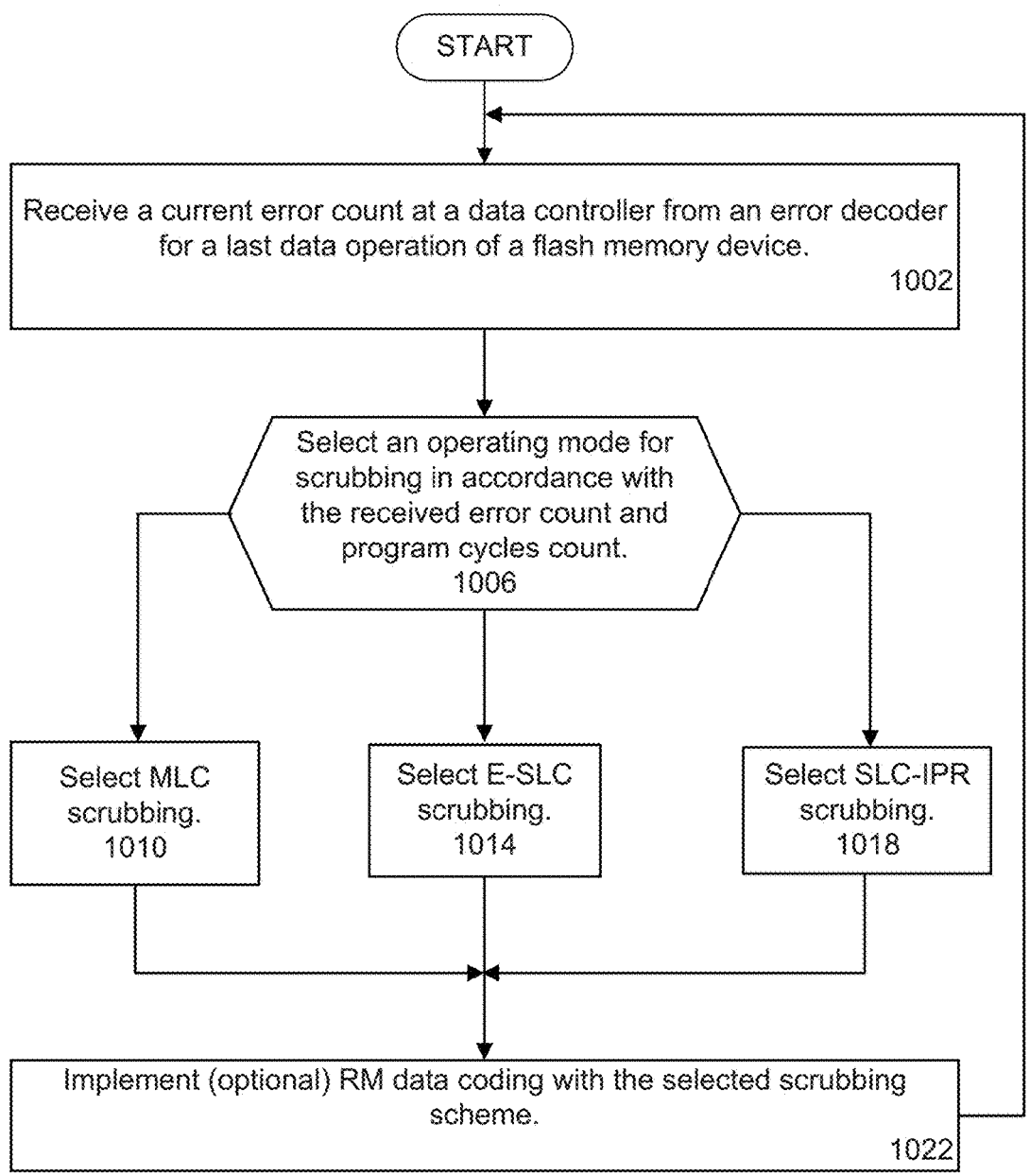
FIG. 10 is a flow diagram that shows programming operations of a data storage device constructed in accordance with the description herein.

FIG. 10 is a flow diagram that shows operations of a data storage device that includes storage elements such as memory cells and operates according to the scrubbing schemes described herein. The reading operations will determine charge levels of the n storage elements in a memory cell according to the RM scheme, and will implement the scrubbing operations described herein. In the first operation, indicated by box 1002, the data storage device memory controller receives a current error count from an error decoder of the device. The error count is indicative of a recent data storage operation and indicates the number of data errors that were detected by the error decoder. At the next operation, box 1006, the memory controller selects an operating mode for scrubbing in accordance with the received error count and a program cycles count. The program cycles count is known to the data memory controller through normal operation, and reflects a count of program (i.e., data write) cycles. The program cycles count is a count of the number of program cycles for data cells under control of the memory controller. The program cycles may relate to, for example, the highest number of program cycles for any of the cells controlled by the memory controller, or the program cycles may relate to an average of program cycles over all memory cells of the device, or may be the result of a different calculation of memory cell program cycles, or a combination of program cycle count schemes, depending on the desired operation of the memory device.

FIG. 10 shows that the memory controller selects between scrubbing operation modes of MLC scrubbing 1010, E-SLC scrubbing 1014, or SLC-IPR scrubbing 1018. Details of these scrubbing modes were discussed above. After the scrubbing mode selection, the next depicted operation at the box 1022 is to implement optional RM data coding with the selected scrubbing scheme. In the experiments performed, it was determined that RM is also beneficial for mitigating errors due to the severe operating environment, such as radiation from outer space deployment. This feature of using RM for data coding was not previously known. The operation of the device memory controller then returns to the first box 1002, where the controller receives the error count from the error decoder, and the process repeats. It should be noted that the order of operations may differ from that illustrated in FIG. 10 without departing from the disclosure. For example, the RM coding operation 1022 may occur prior to the scrubbing selection, if it is performed at all (it is optional).

Figure 11:
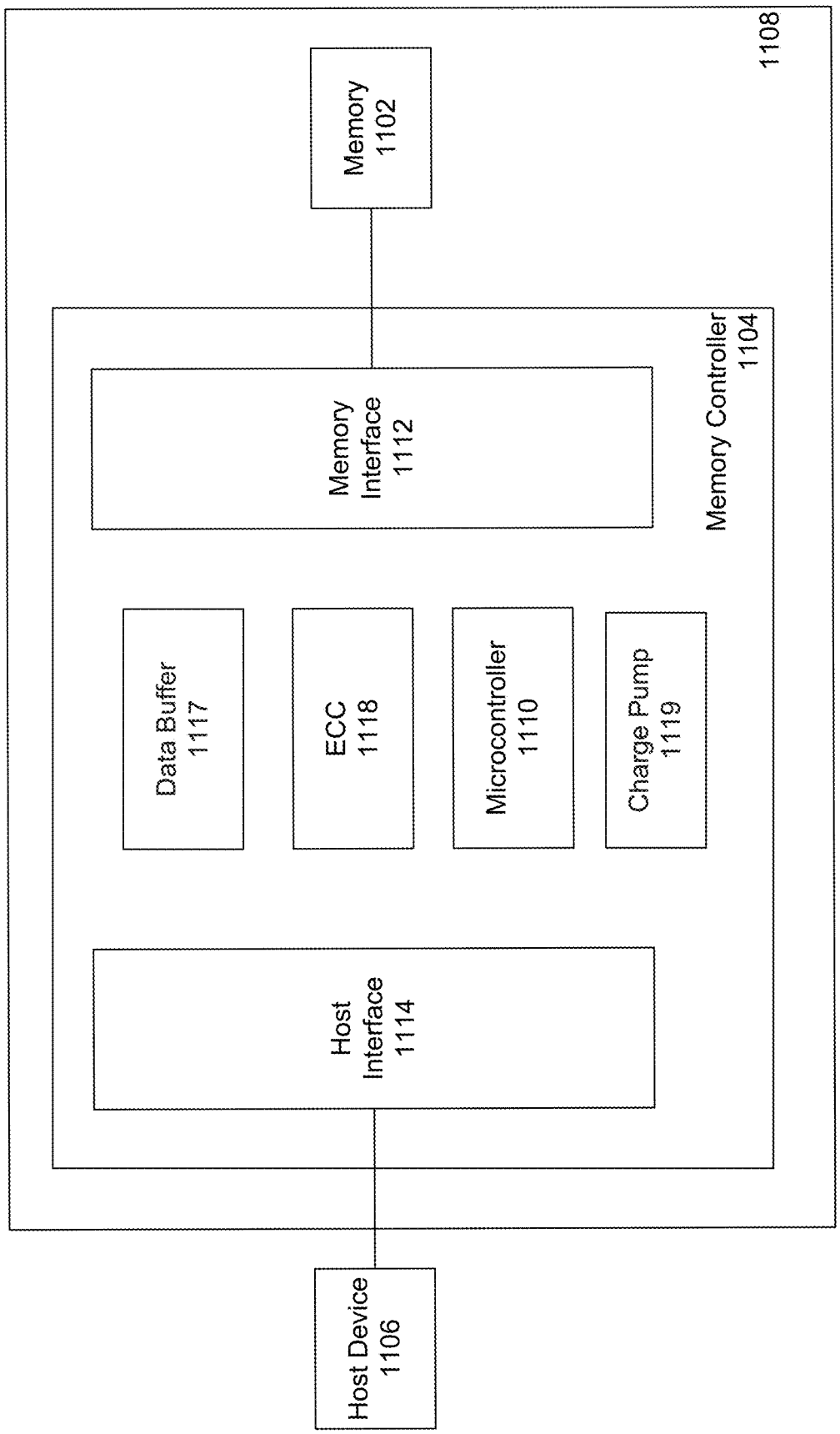
FIG. 11 is an illustration of a memory device constructed in accordance with the present invention.

FIG. 11 is an illustration of a data device constructed to perform the data error mitigation features in accordance with the present disclosure. FIG. 11 shows a memory 1102 that is accessed by a memory controller 1104 that communicates with a host device 1106. The memory 1102 is used for storing data that is represented in accordance with a rank modulation coding scheme and is scrubbed according to the operation modes described herein. The memory may be implemented, for example, as a Flash memory having multilevel cells. The memory 1102 and memory controller 1104 together comprise a data storage device 1108 that may be external to the host device or may be integrated with the host device into a single component or system. For example, the data storage device 1108 may comprise a Flash memory device (often referred to as a "thumb drive") that communicates with a host computer 1106 via a USB connection, or the data storage device may comprise a solid state drive (SSD) that stores data for a host computer system. Alternatively, the data storage device may be integrated with a suitable host device to comprise a single system or component with rank modulation memory, such as a smart phone, network router, MP3 player, or the like. As noted above, the data storage coding and scrubbing techniques described herein are especially suited for severe environments, such as space applications, GEO orbits and other deep space trajectories, radiation exposure, extremes of temperature, and the like.

The memory controller 1104 operates under control of a microcontroller 1110, which manages communications with the memory 1102 via a memory interface 1112 and manages communications with the host device via a host interface 1114. Thus, the memory controller supervises data transfers from the host 1106 to the memory 1102 and from the memory 1102 to the host 1106. The memory controller 1104 also includes a data buffer 1116 in which data values may be temporarily stored for transmission over the data channel controller 1116 between the memory 1102 and the host 1106. The memory controller also includes an ECC block 1118 in which data for the ECC is maintained. For example, the ECC block 1118 may comprise data and program code to perform error correction operations for rank modulation code. Such error correction operations are described, for example, in the U.S. patent application entitled "Error Correcting Codes for Rank Modulation" by Anxiao Jiang et al. filed Nov. 20, 2008. The ECC block 1118 may contain parameters for the error correction code to be used for the memory 1102, such as programmed operations for translating between received symbols and error-corrected symbols, or the ECC block may contain lookup tables for codewords or other data, or the like. The memory controller also includes a charge pump 1119, which provides the electrical charge necessary for maintaining the charge levels of the memory cells at the proper levels for implementing the RM coding scheme and the selected scrubbing schemes. The memory controller 1104 performs the operations described above for decoding data and for encoding data.

The operations described above for operating a data storage device, for data operations including selected scrubbing data modes, can be carried out by the operations depicted in FIG. 10, which can be performed by the microcontroller 1110 and associated components of the data storage device 1108. For example, in an implementation of the rank modulation coding scheme and scrubbing operations in a USB thumb drive, all the components of the data storage device 1108 depicted in FIG. 11 are contained within the USB thumb drive. The operation described herein is especially suited for severe environments, such as space flight, in which the rank modulation and scrubbing operations would most likely be implemented in a memory module of a spacecraft or a satellite or the like.

Figure 12:
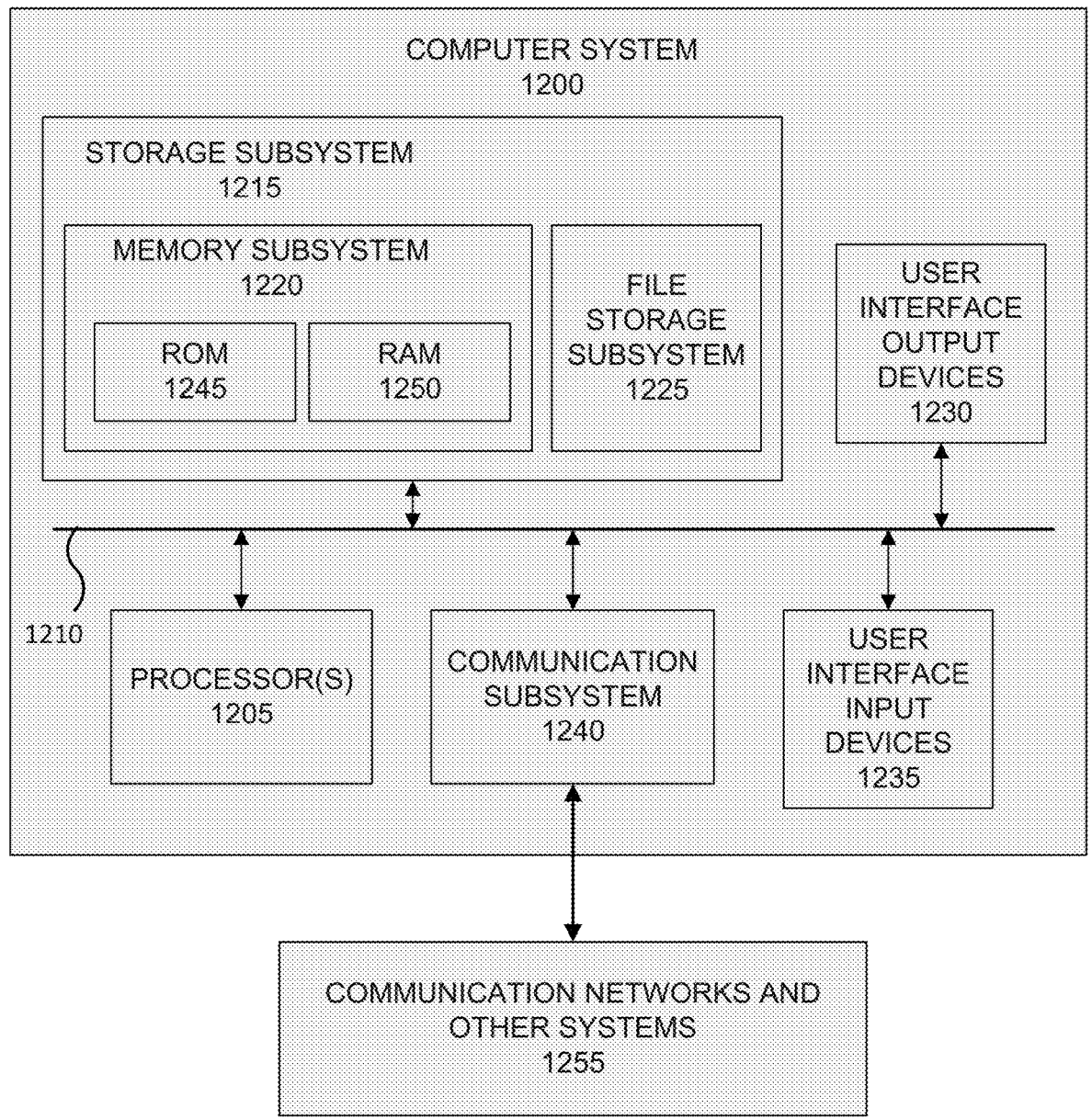
FIG. 12 is a block diagram of a computer apparatus for performing the programming and reading operations described herein and for communicating with a memory device such as depicted in FIG. 11.

The processing components such as the controller 1104 and microcontroller 1110 may be implemented in the form of control logic in software or hardware or a combination of both, and may comprise processors that execute software program instructions from program memory, or as firmware, or the like. The host device 1106 may comprise a conventional computer apparatus. A conventional computer apparatus also may carry out the operations described herein and depicted in FIG. 10. FIG. 12 is a block diagram of a computer apparatus 1200 sufficient to perform as a host device and sufficient to perform the operations described herein and depicted in FIG. 10.

FIG. 12 is a block diagram of a computer system 1200 that may incorporate embodiments of the present invention and perform the operations described herein. The computer system 1200 typically includes one or more processors 1205, a system bus 1210, storage subsystem 1215 that includes a memory subsystem 1220 and a file storage subsystem 1225, user interface output devices 1230, user interface input devices 1235, a communications subsystem 1240, and the like.

In various embodiments, the computer system 1200 typically includes conventional computer components such as the one or more processors 1205. The file storage subsystem 1225 can include a variety of memory storage devices, such as a read only memory (ROM) 1245 and random access memory (RAM) 1250 in the memory subsystem 1220, and direct access storage devices such as disk drives. As noted, the direct access storage device may comprise a rank modulation data storage device that operates as described herein.

The user interface output devices 1230 can comprise a variety of devices including flat panel displays, touchscreens, indicator lights, audio devices, force feedback devices, and the like. The user interface input devices 1235 can comprise a variety of devices including a computer mouse, trackball, trackpad, joystick, wireless remote, drawing tablet, voice command system, eye tracking system, and the like. The user interface input devices 1235 typically allow a user to select objects, icons, text and the like that appear on the user interface output devices 1230 via a command such as a click of a button or the like.

Embodiments of the communication subsystem 1240 typically include an Ethernet card, a modem (telephone, satellite, cable, ISDN), (asynchronous) digital subscriber line (DSL) unit, FireWire (IEEE 1394) interface, USB interface, and the like. For example, the communications subsystem 1240 may be coupled to communications networks and other external systems 1255 (e.g., a network such as a LAN or the Internet), to a FireWire bus, or the like. In other embodiments, the communications subsystem 1240 may be physically integrated on the motherboard of the computer system 1200, may be a software program, such as soft DSL, or the like.

The RAM 1250 and the file storage subsystem 1225 are examples of tangible media configured to store data such as error correction code parameters, codewords, and program instructions to perform the operations described herein when executed by the one or more processors, including executable computer code, human readable code, or the like. Other types of tangible media include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 1225 includes reader subsystems that can transfer data from the program product media to the storage subsystem 1215 for operation and execution by the processors 1205.

The computer system 1200 may also include software that enables communications over a network (e.g., the communications network 1255) such as the DNS, TCP/IP, UDP/IP, and HTTP/HTTPS protocols, and the like. In alternative embodiments, other communications software and transfer protocols may also be used, for example IPX, or the like.

It will be readily apparent to one of ordinary skill in the art that many other hardware and software configurations are suitable for use with the present invention. For example, the computer system 1200 may be a desktop, portable, rack-mounted, or tablet configuration. Additionally, the computer system 1200 may be a series of networked computers. Further, a variety of microprocessors are contemplated and are suitable for the one or more processors 1205, such as PENTIUM™ microprocessors from Intel Corporation of Santa Clara, Calif., USA; OPTERON™ or ATHLON XP™ microprocessors from Advanced Micro Devices, Inc. of Sunnyvale, Calif., USA; and the like. Further, a variety of operating systems are contemplated and are suitable, such as WINDOWS®, WINDOWS XP®, WINDOWS VISTA®, or the like from Microsoft Corporation of Redmond, Wash., USA, SOLARIS® from Sun Microsystems, Inc. of Santa Clara, Calif., USA; MAC OS available from Apple, Inc. of Sunnyvale, Calif., USA; various Linux and UNIX distributions, and the like. In still other embodiments, the techniques described above may be implemented upon a chip or an auxiliary processing board (e.g., a programmable logic device or graphics processor unit).

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

The rank modulation scheme can be implemented in a variety of systems for encoding and decoding data for transmission and storage. That is, codewords are received from a source over an information channel according to a rank modulation scheme and are decoded into their corresponding data values and provided to a destination, such as a memory or a processor, and data values for storage or transmission are received from a source over an information channel and are encoded into a rank modulation scheme.

Figure 13:
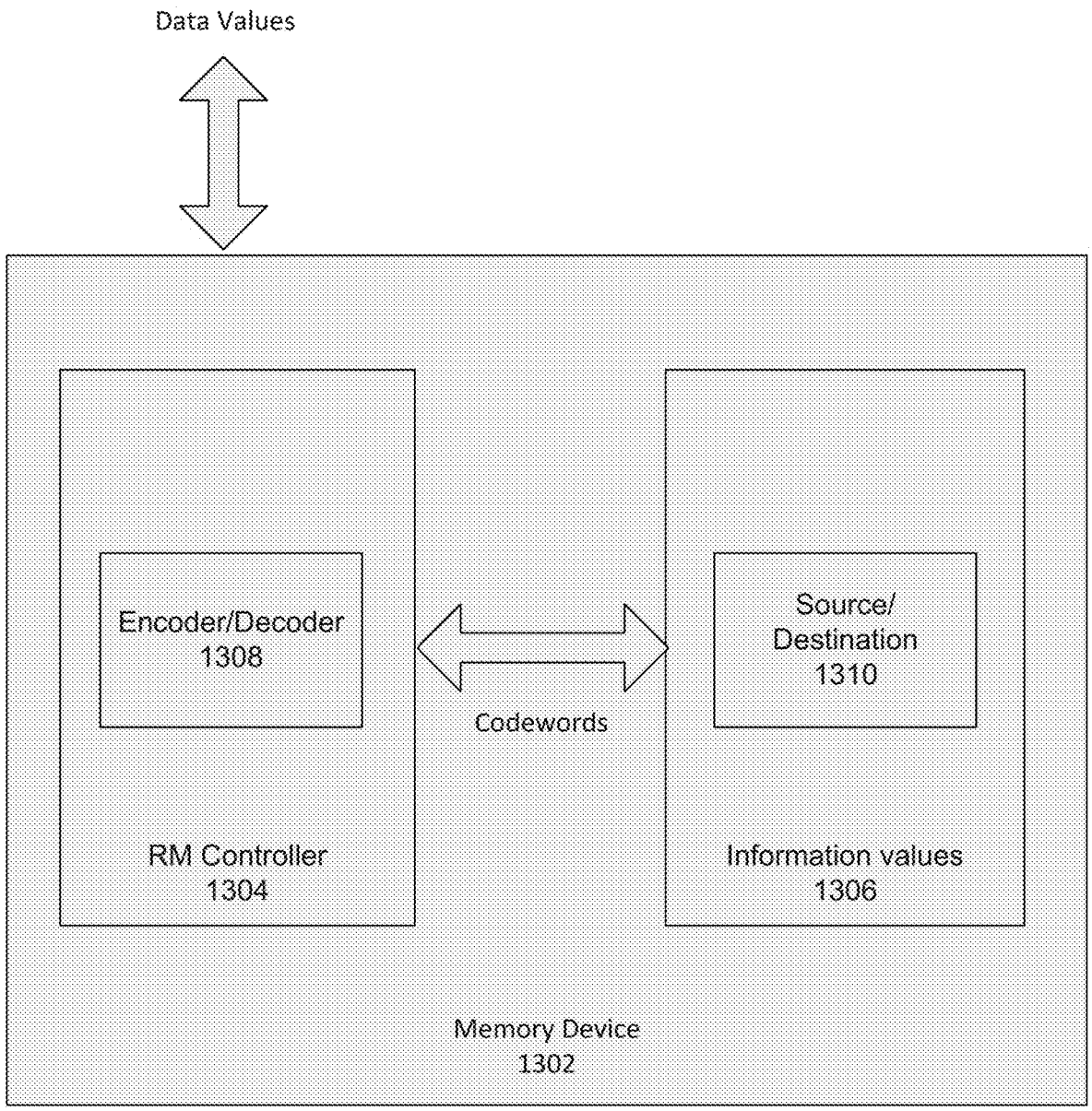
FIG. 13 is a block diagram that shows data flow in a memory device that operates according to the rank modulation scheme described herein.

The operations of encoding and decoding data according to the rank modulation scheme can be illustrated as in FIG. 13, which shows data flow in a data device 1302 that operates according to the rank modulation scheme described herein. In FIG. 13, the device includes a Rank Modulation (RM) controller 1304 that stores and retrieves information values 1306. The RM controller 1304 includes an encoder and decoder 1308 for encoding data values into codewords and decoding codewords into data values. The RM controller encodes data values and provides codewords to the source/destination block 1310, and decodes codewords from the source/destination and provides corresponding data values. The two-way nature of the data flow is indicated by the double-ended arrows labeled "data values" and "codewords". The RM controller includes interfaces through which the RM controller receives and provides the data values and the information values (codewords). The details of such interfaces will be known to those skilled in the art.

The information values 1306 comprise the means for physically representing data comprising the data values and codewords. For example, the information values 1306 may represent charge levels of memory cells, such that multiple cells are configured to operate as a virtual cell in which charge levels of the cells determine a permutation of the rank modulation code. Data values are received and encoded to permutations of a rank modulation code and charge levels of cells are adjusted accordingly, and rank modulation codewords are determined according to cell charge levels, from which a corresponding data value is determined. Alternatively, the information values 1306 may represent features of a transmitted signal, such as signal frequency, magnitude, or duration, such that the cells or bins are defined by the signal features and determine a permutation of the rank modulation code. For example, rank ordering of detected cell frequency changes over time can determine a permutation, wherein the highest signal frequency denotes the highest cell level. Other schemes for physical representation of the cells will occur to those skilled in the art, in view of the description herein.

For information values 1306 in the case of cell charge levels, the source/destination 1310 comprises memory cells in which n memory cells provide n cell values whose charge levels define a rank modulation permutation. For storing a codeword, the memory cells receive an encoded codeword and comprise a destination, and for reading a codeword, the memory cells provide a codeword for decoding and comprise a source. In the case of data transmission, the source/destination 1310 may comprise a transmitter/receiver that processes a signal with signal features such as frequency, magnitude, or duration that define cells or bins such that the signal features determine a permutation. That is, signal components comprising signal frequency, magnitude, or duration may be controlled and modulated by the transmitter such that a highest signal frequency component or greatest magnitude component or greatest time component corresponds to a highest cell level, followed by signal component values that correspond to other cell values and thereby define a permutation of the rank modulation code. When the source/destination 1310 receives a codeword from the controller 1304, the source/destination comprises a transmitter of the device 1302 for sending an encoded signal. When the source/destination provides a codeword to the controller 1304 from a received signal, the source/destination comprises a receiver of the device for receiving an encoded signal. Those skilled in the art will understand how to suitably modulate signal components of the transmitted signal to define rank modulation code permutations, in view of the description herein.

VI. Conclusion

In summary, a simple method to make RM implementable using existing flash memories has been described and disclosed. The implementation of RM has been evaluated under different types of noise in flash, and evaluation results show that RM provides excellent reliability compared to conventional MLC. Moreover, it has been demonstrated that the use of RM in flash-based archival storage significantly extends the data retention time. The disclosure herein not only brings RM into practice, but also can shed new light on designing more reliable flash memory in the future.

What is claimed is:

1. A radiation hardened computer system apparatus suitable for space flight, the apparatus comprising:
    one or more processors;
    a communication subsystem operatively coupled with the one or more processors;
    a flash memory operatively coupled with the one or more processors;
    a charge pump operatively configured for page reading, page programming, and block erasure of memory cells in the flash memory;
    an error correcting code (ECC) block including program code for rank modulation coding and decoding of data to and from the flash memory; and
    a memory controller microcontroller configured for selecting a scrubbing mode for the flash memory from a plurality of scrubbing modes based on a current error count for one or more data operations and a program cycles count for the flash memory.

2. The apparatus of claim 1, wherein the plurality of scrubbing modes comprises an MLC (multi-level cell) scrubbing scheme, an E-SLC (enhanced single-level cell) scrubbing scheme, and an SLC-IPR (single level cell in-place rewriting) scrubbing scheme.

3. The apparatus of claim 2, wherein the MLC scrubbing scheme is configured to use sequential MLC programming to set a charge level of each cell of the memory according to four or more charge levels.

4. The apparatus of claim 2, wherein the E-SLC scrubbing scheme is configured to use only two states of available charge level states in each cell of the memory.

5. The apparatus of claim 2, wherein the SLC-IPR scrubbing scheme is configured to use block erasure for rewriting a cell and in-place rewriting of charge level states in each cell of the memory.

6. The apparatus of claim 1, wherein at least one scrubbing mode of the plurality of scrubbing modes uses only a high voltage state and a low voltage state for cells of the memory or uses two voltage levels for each of the memory cells out of four voltage levels that are available for each of the memory cells.

7. The apparatus of claim 1, wherein at least one of the plurality of scrubbing modes is configured to perform a data storage operation without first performing a block erasure operation.

8. The apparatus of claim 1, wherein the ECC block includes programmed operations for translating between received symbols and error-corrected symbols.

9. The apparatus of claim 1, wherein the ECC block includes lookup tables for codewords.

10. The apparatus of claim 1, further comprising: shielding around the flash memory.

11. A series of networked satellite computers, each comprising the apparatus of claim 1.

12. A computer implemented method of operating radiation hardened NAND flash memory data storage apparatus suitable for space flight, the method comprising:
    receiving a current error count at a satellite computer system memory controller microcontroller for one or more data operations and a program cycles count for a flash memory having memory cells, the current error count indicating errors detected in the flash memory;
    selecting a scrubbing mode based upon the current error count and the program cycles count;
    scrubbing the flash memory in accordance with the selected scrubbing mode; and
    coding and decoding data to and from the flash memory using rank modulation.

13. The method of claim 12, wherein the selected scrubbing mode comprises one of an MLC (multi-level cell) scrubbing scheme, an E-SLC (enhanced single-level cell) scrubbing scheme, and an SLC-IPR (single level cell in-place rewriting) scrubbing scheme.

14. The method of claim 13, wherein the MLC scrubbing scheme uses sequential MLC programming to set a charge level of each cell of the memory according to four or more charge levels.

15. The method of claim 13, wherein the E-SLC scrubbing scheme uses only two states of available charge level states in each cell of the memory.

16. The method of claim 13, wherein the SLC-IPR scrubbing scheme does not use block erasure for rewriting a cell and uses in-place rewriting of charge level states in each cell of the memory.

17. The method as in claim 12, wherein the selected scrubbing mode uses only a high voltage state and a low voltage state for cells of the memory or uses two voltage levels for each of the memory cells out of four voltage levels that are available for each of the memory cells.

18. The method as in claim 12, wherein the selected scrubbing mode includes performing a data storage operation without first performing a block erasure operation.

19. The method of claim 12, wherein the coding and decoding includes translating between received symbols and error-corrected symbols.

20. The method of claim 12, wherein the coding and decoding includes accessing lookup tables for codewords.

* * * * *